United States Patent
Gong et al.

(10) Patent No.: US 9,917,584 B2
(45) Date of Patent: Mar. 13, 2018

(54) VOLTAGE CONVERTER INTEGRATED CIRCUIT WITH AN INTEGRATED BOOTSTRAP CAPACITOR

(71) Applicant: Chengdu Monolithic Power Systems, Co., Ltd., Chengdu (CN)

(72) Inventors: Junyong Gong, Chengdu (CN); Jian Jiang, Los Gatos, CA (US); Yike Li, Chengdu (CN); Changjiang Chen, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/272,412

(22) Filed: Sep. 21, 2016

(65) Prior Publication Data

US 2017/0324411 A1    Nov. 9, 2017

(30) Foreign Application Priority Data

May 6, 2016   (CN) .......................... 2016 1 0298239

(51) Int. Cl.
*H03K 19/017*   (2006.01)
*H02M 3/07*   (2006.01)

(52) U.S. Cl.
CPC ........ *H03K 19/01735* (2013.01); *H02M 3/07* (2013.01); *H03K 19/01714* (2013.01)

(58) Field of Classification Search
CPC ................... H03K 19/01735; H03K 19/01714
See application file for complete search history.

(56) References Cited

U.S. PATENT DOCUMENTS

| | | | | |
|---|---|---|---|---|
| 5,428,576 A * | 6/1995 | Furuyama | ............... | G11C 5/145 365/189.09 |
| 5,818,209 A * | 10/1998 | Masini | .................. | H03F 3/2171 323/224 |
| 7,106,105 B2 * | 9/2006 | Bryson | ................. | H03F 3/2171 326/82 |
| 7,265,601 B2 * | 9/2007 | Ahmad | ................... | H02M 1/08 323/313 |
| 7,679,218 B1 * | 3/2010 | Isham | ..................... | H02M 1/08 307/75 |
| 7,741,901 B2 * | 6/2010 | Lu | ......................... | H03K 17/162 323/224 |
| 7,986,172 B2 * | 7/2011 | Sicard | ............. | H03K 17/04206 327/108 |
| 8,558,586 B1 * | 10/2013 | Martin | ................. | G11C 7/1057 327/108 |
| 9,350,241 B2 * | 5/2016 | Chang | .................... | H02M 3/158 |
| 9,577,520 B2 * | 2/2017 | Xiu | ........................ | H02M 1/08 |
| 2007/0182390 A1 * | 8/2007 | Ishii | ..................... | H03K 17/163 323/282 |
| 2017/0155323 A1 * | 6/2017 | Umemoto | ............. | H02M 3/158 |
| 2017/0163258 A1 * | 6/2017 | Kinzer | ................. | H03K 17/687 |

* cited by examiner

Primary Examiner — Thomas J Hiltunen
(74) Attorney, Agent, or Firm — Perkins Coie LLP

(57) ABSTRACT

A bootstrap circuit integrated to a voltage converter integrated circuit (IC) and a voltage converter IC for a switch mode voltage regulator. The bootstrap circuit is used to provide a bootstrap voltage signal for driving a high side switch of the voltage converter IC. The bootstrap circuit has a pre-charger and a bootstrap capacitor. The pre-charger provides a first bootstrap signal to pre-charge a control terminal of the high side switch, and the bootstrap capacitor provides a second bootstrap signal to enhance the charge of the control terminal of the high side switch.

16 Claims, 5 Drawing Sheets

US 9,917,584 B2

VOLTAGE CONVERTER INTEGRATED CIRCUIT WITH AN INTEGRATED BOOTSTRAP CAPACITOR

CROSS-REFERENCE TO RELATED APPLICATION(S)

This application claims the benefit of CN application No. 201610298239.0 filed on May 6, 2016 and incorporated herein by reference.

TECHNICAL FIELD

This disclosure generally relates to electronic circuits, and more particularly but not exclusively relates to voltage converter integrated circuits (ICs) with an integrated bootstrap capacitor.

BACKGROUND

Power regulators such as switch-mode voltage regulators are widely used in various electronic devices. In the presently existing switch-mode voltage regulators, a high voltage signal used to drive a high side switch may be needed. Thus, a bootstrap circuit will be applied to provide the high voltage signal, wherein the bootstrap circuit may comprise a bootstrap capacitor having a large capacitance. Generally, in order to save size and improve efficiency of the switch-mode voltage regulators, most of the components of the switch-mode voltage regulators are integrated on a monolithic die. However, the bootstrap capacitor is too large to integrate. For example, FIG. 1 illustrates a switch-mode voltage regulator 50 having a voltage converter IC 60 and an external bootstrap capacitor $C_{BO}$. As shown in FIG. 1, the voltage converter IC 60 has an input pin IN, a ground pin GND, a bootstrap pin BST, a switching pin SW and a feedback pin FB. The bootstrap capacitor $C_{BO}$ may be coupled externally between the switching pin SW and the bootstrap pin BST, which can result in large package size and lower efficiency.

SUMMARY

Embodiments of the present invention are directed to bootstrap circuit integrated to a voltage converter integrated circuit (IC), wherein the bootstrap circuit is configured to provide a bootstrap voltage signal for driving a high side switch of the voltage converter IC. The bootstrap circuit comprises a pre-charge and a bootstrap capacitor. The pre-charger is configured to provide a first bootstrap signal to pre-charge a control terminal of the high side switch, and the bootstrap capacitor is configured to provide a second bootstrap signal to enhance the charge of the control terminal of the high side switch.

Embodiments of the present invention are further directed to a voltage converter IC having an input pin, a switching pin, a feedback pin and a logic ground pin. The voltage converter IC comprises a switching circuit, a control circuit and a bootstrap circuit. The switching circuit has a high side switch and a low side switch, wherein the high side switch and the low side switch are connected in series between the input pin and the logic ground pin; a common connection of the high side switch and the low side switch is operated as a switching pin; and the switching circuit is configured to convert the input voltage at the input pin to a switching voltage at the switching pin by controlling the high side switch and the low side switch. The control circuit is coupled to the feedback pin to receive a feedback signal, and further configured to generate a high side control signal and a low side control signal respectively based on the feedback signal. The bootstrap circuit is configured to receive the high side control signal and the input voltage signal, and further configured to provide a bootstrap voltage signal based on the high side control signal and the input voltage signal, wherein the bootstrap voltage signal is configured to charge the control terminal of the high side switch through a driving circuit. The bootstrap circuit comprises a pre-charger and a bootstrap capacitor; and wherein the bootstrap voltage signal comprises a first bootstrap signal and a second bootstrap signal, the pre-charger is configured to provide the first bootstrap signal, and the bootstrap capacitor is configured to provide the second bootstrap signal.

Embodiments of the present invention are further directed to a driving method for voltage converter IC having an integrated bootstrap capacitor, wherein the voltage converter IC has a high side switch and a low side switch being turned on and off complementarily. The driving method comprises: charging a bootstrap capacitor when a low side control signal configured to control the low side switch is active; providing a first bootstrap signal by a pre-charge circuit to pre-charge a control terminal of the high side switch when an active edge of the high side control signal configured to control the high side switch arrives; and providing a second bootstrap signal by the bootstrap capacitor to enhance the charge of the control terminal of the high side switch when a high side control signal is active.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
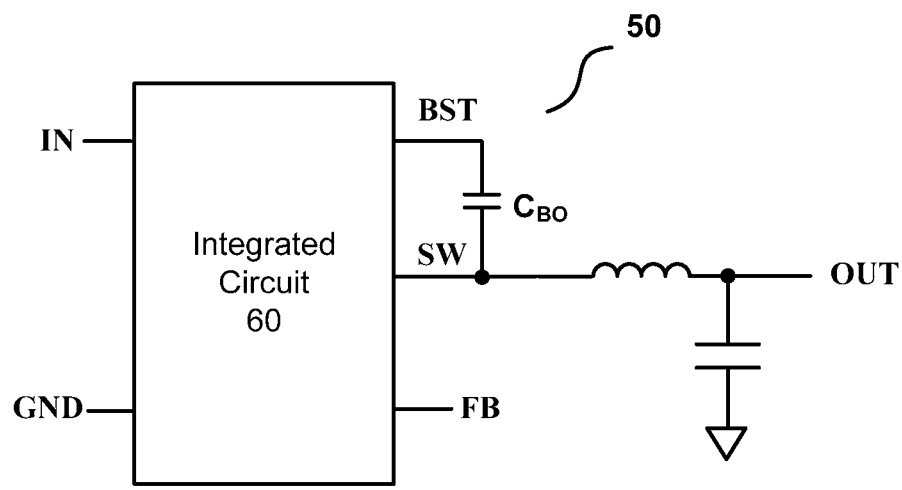
FIG. 1 illustrates a schematic diagram of a typical voltage converter 50.
Figure 2:
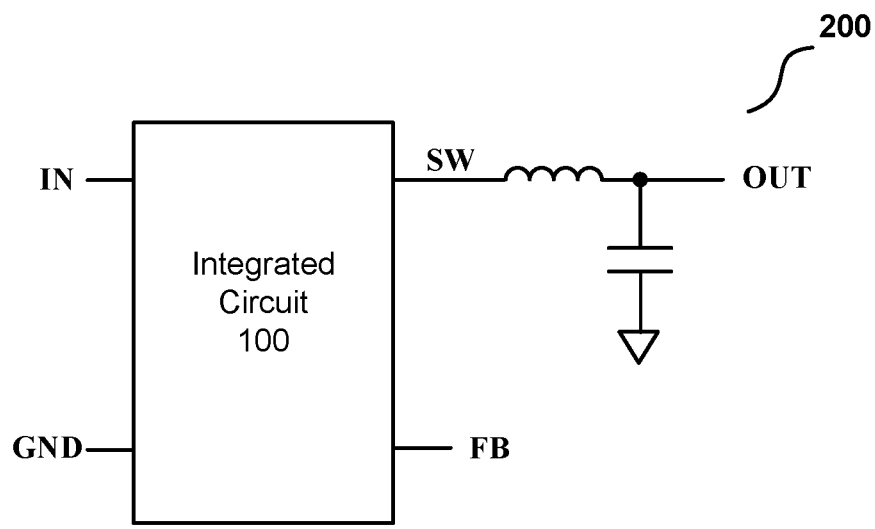
FIG. 2 illustrates a block diagram of a switch-mode voltage regulator 200 in accordance with an exemplary embodiment of the present application.

FIG. 2 illustrates a block diagram of a switch-mode voltage regulator 200 in accordance with an exemplary embodiment of the present application. Comparing to the prior art switch-mode voltage regulator 50, the switch-mode voltage regulator 200 may comprise a voltage converter IC 100 in which a bootstrap capacitor is integrated. The voltage converter IC 100 may just comprise an input pin IN, a ground pin GND, a switching pin SW and a feedback pin FB. A bootstrap pin can be eliminated.

Figure 3:
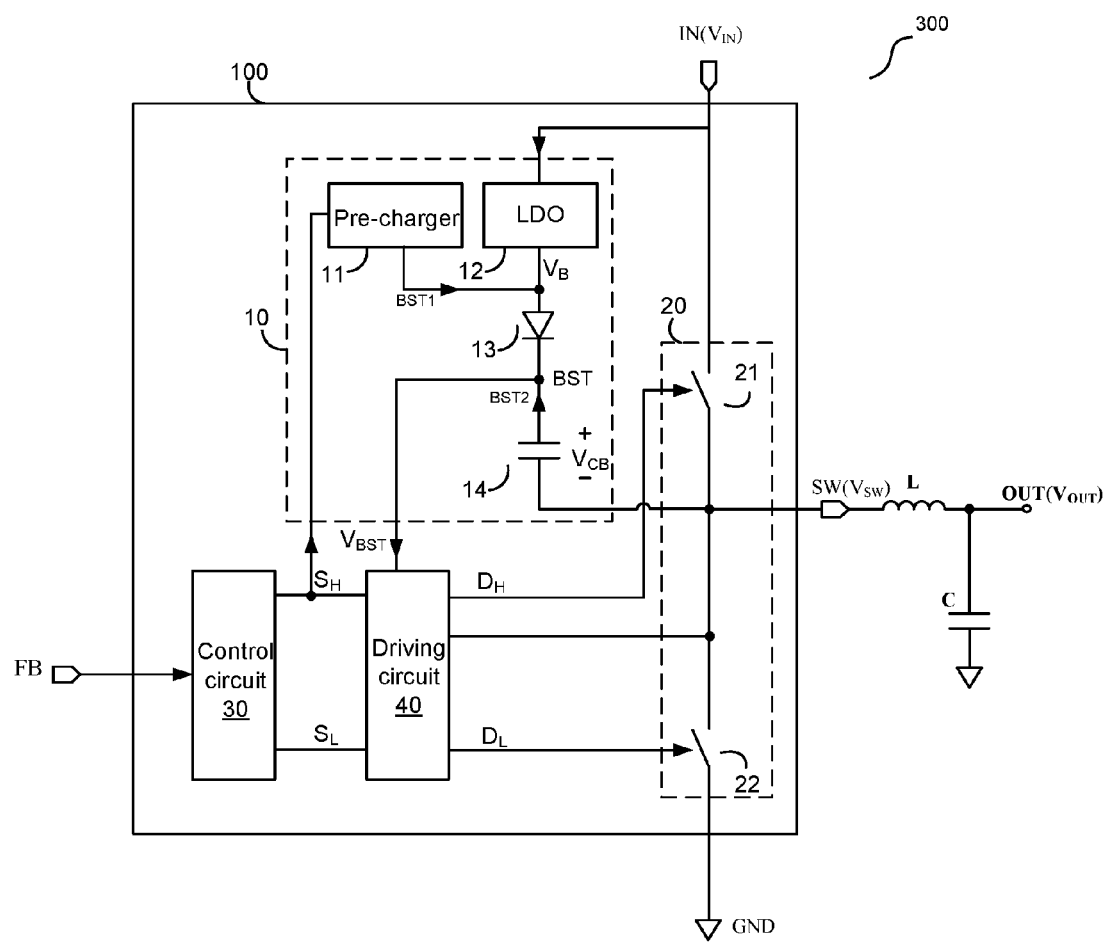
FIG. 3 illustrates a block diagram of a switch-mode voltage regulator 300 in accordance with an exemplary embodiment of the present application.

FIG. 3 illustrates a block diagram of a switch-mode voltage regulator 300 in accordance with an exemplary embodiment of the present application. As shown in FIG. 3, the switch-mode voltage regulator 300 may comprise a voltage converter IC 100. The voltage converter IC 100 may comprise a bootstrap circuit 10, a switching circuit 20, a control circuit 30 and a driving circuit 40.

In the exemplary embodiment of FIG. 3, the switching circuit 20 may comprise a high side switch 21 and a low side switch 22, each of the switches may have a first terminal, a second terminal and a control terminal. The high side switch 21 and the low side switch 22 may comprise a power switching device, such as a Metal Oxide Semiconductor Field Effect Transistor (MOSFET), a Junction Field Effect Transistor (JFET) and so on. The first terminal of the high side switch 21 may be coupled to the input pin IN of the voltage converter IC 100 for receiving an input voltage $V_{IN}$. The second terminal of the high side switch 21 may be coupled to the first terminal of the low side switch 22 so as to form a common connection which can be led out as the switching pin SW of the voltage converter IC 100. The second terminal of the low side switch 22 may be connected to the ground pin GND of the voltage converter IC 100. The switching circuit 20 may be configured to convert the input voltage $V_{IN}$ to a switching voltage $V_{SW}$ by controlling the high side switch 21 and the low side switch 22 on and off. Generally, the switching pin SW of the voltage converter IC 100 may be further coupled to an inductor L and a capacitor C so as to provide an output voltage signal $V_{OUT}$ at an output terminal OUT of the switch-mode voltage regulator 300.

In the exemplary embodiment of FIG. 3, the control circuit 30 may be configured to receive a feedback signal representing the output voltage signal $V_{OUT}$ from the feedback pin FB of the voltage converter IC 100, and further configured to generate a high side control signal $S_H$ and a low side control signal $S_L$ to control the high side switch 21 and the low side switch 22 in a complementary manner. In one embodiment, the control circuit 30 may comprise a Pulse-Width Modulation (PWM) control circuit, wherein the PWM control circuit may be configured to regulate the output voltage signal $V_{OUT}$ by providing a plurality of square pulse signals with varied duty cycle.

In the exemplary embodiment of FIG. 3, the driving circuit 40 may be configured to receive the high side control signal $S_H$, the low side control signal $S_L$, and an bootstrap voltage signal $V_{BST}$, and further configured to provide a high side driving signal $D_H$ and a low side driving signal $D_L$ to the control terminals of the high side switch 21 and the low side switch 22 respectively so as to drive the high side switch 21 and the low side switch 22 on and off.

In order to make the high side switch 21 to be fully turned on (i.e., to make the high side switch 11 to operate in saturation region in which the high side switch 21 has a quite small on resistance), the high side driving signal $D_H$ must be large enough, at least larger than a conduction threshold voltage $V_{TH}$ of the high side switch 21. However, the switching voltage $V_{SW}$ at the switching pin SW may get to the input voltage $V_{IN}$ quickly once a voltage signal is applied at the control terminal of the high side switch 21. Thus, the high side driving signal $D_H$ must be higher than the input voltage $V_{IN}$ so as to turn the high side switch 11 on completely. Thereupon, the bootstrap circuit 10 is needed in the voltage converter IC 100.

The bootstrap circuit 10 may comprise a first terminal, a second terminal, a third terminal and a fourth terminal, wherein the first terminal of the bootstrap circuit 10 may be coupled to the input pin IN of the voltage converter IC 100 to receive the input voltage $V_{IN}$; the second terminal of the bootstrap circuit 10 may be coupled to the switching pin SW of the voltage converter IC 100; and the third terminal of the bootstrap circuit 10 may be coupled to the control circuit 30 to receive the high side control signal $S_H$. The bootstrap circuit 10 may be configured to generate the bootstrap voltage signal $V_{BST}$ at the fourth terminal of the bootstrap circuit 10.

In the exemplary embodiment of FIG. 3, the bootstrap circuit 10 may be integrated into the voltage converter IC 100, wherein the bootstrap circuit 10 comprises a pre-charger 11 and a bootstrap capacitor 14. The pre-charger 11 and the bootstrap capacitor 14 may be coupled to the control terminal of the high side switch 21, and configured to synchronically charge the control terminal of the high side switch 21. Specifically, the pre-charger 11 may be configured to pre-charge the control terminal of the high side switch 21, and the bootstrap capacitor 14 may be configured to enhance the charge of the control terminal of the high side switch 21. The pre-charger 11 may be coupled to the third terminal of the bootstrap circuit 10 so as to receive the high side control signal $S_H$, and further configured to provide a first bootstrap signal BST1. The bootstrap capacitor 14 having a first terminal and a second terminal may be configured to provide a second bootstrap signal BST2. The first terminal of the bootstrap capacitor 14 may be coupled to the fourth terminal of the bootstrap circuit 10, and the second terminal of the bootstrap capacitor 14 may be coupled to the second terminal of the bootstrap circuit 10 so as to be coupled to the switching pin SW.

In the exemplary embodiment of FIG. 3, the bootstrap circuit 10 may further comprise a Low Drop Out linear regulator (LDO) 12 and a diode 13 having an anode and a cathode. The LDO 12 may be coupled to the first terminal of the bootstrap circuit 10 to receive the input voltage signal $V_{IN}$, and further configured to regulate the input voltage signal $V_{IN}$ so as to provide a supply voltage signal $V_B$, wherein the supply voltage signal $V_B$ is smaller than the input voltage signal $V_{IN}$. The anode of the diode 13 may be coupled to the LDO 12 and the pre-charger 11 to receive the supply voltage signal $V_B$ and the first bootstrap signal BST1 respectively; the cathode of the diode 13 may be coupled to the first terminal of the bootstrap capacitor 14 to form a common connection BST, wherein the voltage signal at the common connection BST is the bootstrap voltage signal $V_{BST}$. In one embodiment, when the high side control signal $S_H$ is high, the bootstrap voltage signal $V_{BST}$ is provided as the high side driving signal $D_H$.

When the high side control signal $S_H$ is low and the low side control signal $S_L$ is high, the high side driving signal $D_H$ is configured to turn the high side switch 21 off while the low side driving signal $D_L$ is configured to turn the low side switch 22 on so that the voltage of the switching pin SW is equal to a ground potential and the bootstrap capacitor 14 is charged by the bootstrap supply voltage $V_B$ till the voltage across the bootstrap capacitor 14 reaches a voltage value $V_{CB}$. When the high side control signal $S_H$ is high and the low side control signal SL is low, the low side driving signal $D_L$ is configured to turn the low side switch 22 off. Meanwhile, the pre-charger 11 may be operated to provide the first bootstrap signal BST1 to pre-charge the control terminal of the high side switch 21. Furthermore, the bootstrap capacitor 14 is configured to provide the second bootstrap signal BST2, wherein the second bootstrap signal BST2 is equal to the voltage value $V_{CB}$ plus the switching voltage signal $V_{SW}$, and wherein the second bootstrap signal BST2 enhances the charge of the control terminal of the high side switch 21. When the voltage (i.e. the high side driving signal $D_H$) at the control terminal of the high side switch 21 is larger than the conduction threshold voltage $V_{TH}$ of the high side switch 21, the high side switch 21 is turned on. Since the control terminal of the high side switch 21 is pre-charged by the first bootstrap signal BST1 and the second bootstrap signal BST2 at the same time, the bootstrap capacitor 14 having a small capacitance which can be integrated into an IC (e.g. the voltage converter IC 100) may be chosen. For example, in a prior art, a bootstrap capacitor having a capacitance value of 0.1 uF is adopted at the external IC for a high side switch having 3.3V conduction threshold voltage. However, in the present invention, a much smaller bootstrap capacitor, e.g., 500 pF, which can be integrated into an IC is adopted for an application where a high side switch has 3.3V conduction threshold voltage.

Figure 4:
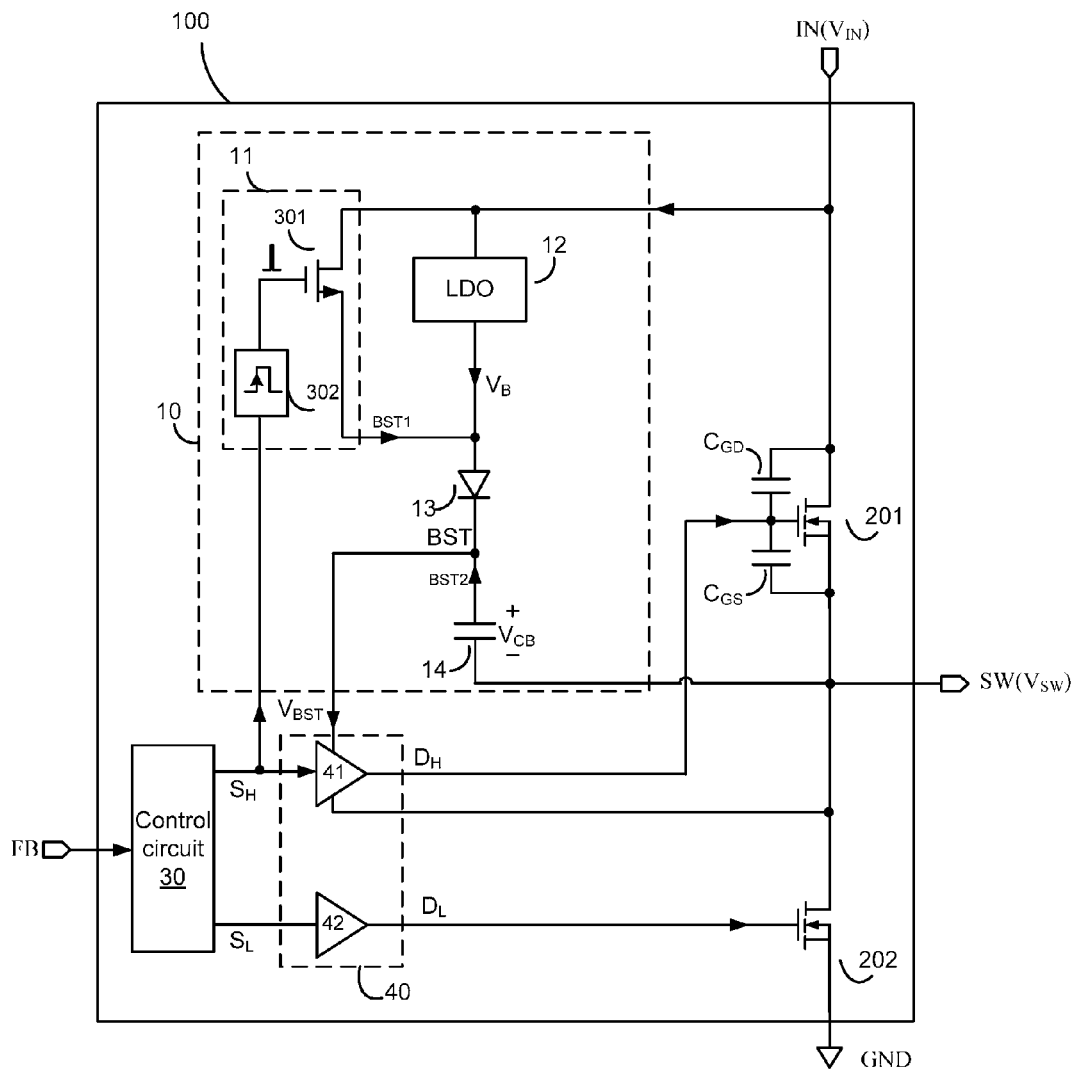
FIG. 4 schematically illustrates the voltage converter IC 100 in accordance with an exemplary embodiment of the present application.

FIG. 4 schematically illustrates the voltage converter IC 100 in accordance with an exemplary embodiment of the present application. In the exemplary embodiment of FIG. 4, the high side switch 21 and the low side switch 22 of FIG. 3 may be illustrated as MOSFET 201 and MOSFET 202 respectively. It should be understood, in other applications, the high side switch 11 and the low side switch 12 of FIG. 3 may comprise other suitable semiconductor devices such as JFETs, Insulated Gate Bipolar Translators (IGBTs) or Double Diffusion Metal Oxide Semiconductor (DMOS) and so on. For a better description of the driving principle of the high side switch 21, a parasitic gate-drain capacitor $C_{GD}$ and a parasitic gate-source capacitor $C_{GS}$ of the MOSFET 201 are illustrated in FIG. 4.

In the exemplary embodiment of FIG. 4, the pre-charger 11 may comprise a switch 301 having a first terminal, a second terminal and a control terminal. The first terminal of the switch 301 is configured to receive the input voltage signal $V_{IN}$, the second terminal of the switch 301 is coupled to the anode of the diode 13 to provide the first bootstrap signal BST1, and the control terminal of the switch 301 is coupled to the third terminal of the bootstrap circuit 10 for receiving the high side control signal $S_H$. In the exemplary embodiment of FIG. 4, the first bootstrap signal BST1 is a voltage signal. In one embodiment, when the high side control signal $S_H$ is in an active state (i.e., the low side switch 22 is turned off and the high side switch 21 needs to be turned on), the switch 301 is turned on. Thus, the first bootstrap signal BST1 is equal to the input voltage signal $V_{IN}$. In one embodiment, the high side control signal $S_H$ is logic high when it is in the active state. In another embodiment, the high side control signal $S_H$ is logic low when it is in the active state. In one embodiment, the switch 301 may comprise a P-type MOSFET.

In the exemplary embodiment of FIG. 4, the pre-charger 11 may further comprise a pulse generator 302 having a first terminal and a second terminal. The first terminal of the pulse generator 302 is coupled to the third terminal of the bootstrap circuit 10 to receive the high side control signal $S_H$, and the second terminal of the pulse generator 302 is coupled to the control terminal of the switch 301. The pulse generator 302 may be configured to generate a pulse signal at the second terminal when an active edge of the high side control signal $S_H$ arrives. For example, if a logic high state of the high side control signal $S_H$ indicates an active state, the active edge of the high side control signal $S_H$ is a rising edge; and if a logic low state of the high side control signal $S_H$ indicates an active state, the active edge of the high side control signal $S_H$ is a declining edge.

In the exemplary embodiment of FIG. 4, the driving circuit 40 may comprise a high side driver 41 configured to drive the high side switch 21 and a low side driver 42 configured to drive the low side switch 22. The high side driver 41 may have an input terminal, a first supply terminal, a second supply terminal and an output terminal. The input terminal of the high side driver 41 may be coupled to the control circuit 30 to receive the high side control signal $S_H$; the first supply terminal of the high side driver 41 may be coupled to the bootstrap circuit 10 to receive a bootstrap voltage signal $V_{BST}$, the second supply terminal of the high side driver 41 may be coupled to the switching pin SW; and the high side driver 41 may be configured to provide a high side driving signal $D_H$ at the output terminal of the high side driver 41 based on the high side control signal $S_H$ and the bootstrap voltage signal $V_{BST}$, wherein the high side driving signal $D_H$ is configured to drive the high side switch 21 on and off in a good condition, i.e., to make the high side switch 11 to operate in saturation region in which the high side switch 21 has a quite small on resistance. The low side driver 42 is configured to receive the low side control signal $S_L$ and to provide a low side driving signal $D_L$.

When the high side control signal $S_H$ is low and the low side control signal $S_L$ is high, the high side driving signal $D_H$ is configured to turn the MOSFET 201 off and the low side driving signal $D_L$ is configured to turn the MOSFET 202 on so that the switching voltage $V_{SW}$ is equal to the ground potential and the bootstrap supply voltage $V_B$ charges the bootstrap capacitor 14 through the diode 13. When the high side control signal $S_H$ is high and the low side control signal $S_L$ is low, the low side driving signal $D_L$ is configured to turn the MOSFET 202 off. The voltage at the second terminal of the bootstrap capacitor 14 is pulled up to the switching voltage $V_{SW}$, thus the voltage at the first terminal of the bootstrap capacitor 14 is raised to the switching voltage $V_{SW}$ plus a voltage $V_{CB}$ across the bootstrap capacitor 14. (i.e., the second bootstrap signal BST2 is equal to $V_{SW}+V_{CB}$), which is provided to the first supply terminal of the high side driver 41 to charge the parasitic gate-source capacitor $C_{GS}$ of the MOSFET 201. Meanwhile, the switch 301 is turned on, the first bootstrap signal BST1 (i.e., the input voltage signal $V_{IN}$) is also provided to the first supply terminal of the high side driver 41 to charge the parasitic gate-source capacitor $C_{GS}$ of the MOSFET 201 through the diode 13. After the bootstrap capacitor 14, the parasitic gate-drain capacitor $C_{GD}$ and the parasitic gate-source capacitor $C_{GS}$ get charge balanced, the MOSFET 201 is turned on once the voltage across the parasitic gate-source capacitor $C_{GS}$ is larger than the conduction threshold of the MOSFET 201.

Figure 5:
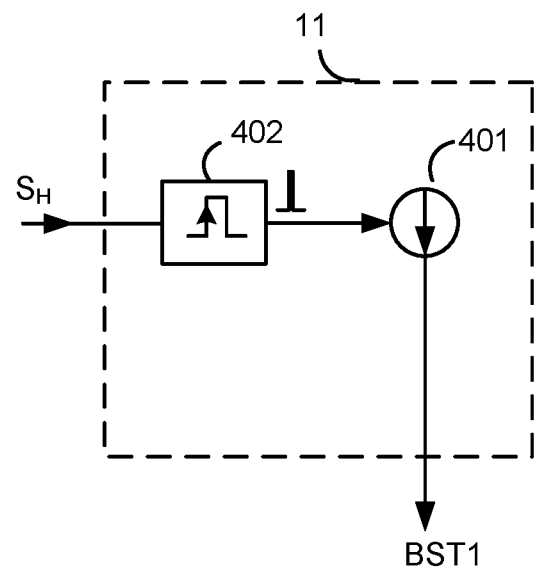
FIG. 5 schematically illustrates the pre-charger 11 in accordance with an exemplary embodiment of the present application.

FIG. 5 schematically illustrates the pre-charger 11 in accordance with an exemplary embodiment of the present application.

In the exemplary embodiment of FIG. 5, the pre-charger 11 may comprise a current source 401 having a control terminal and an output terminal. The current source 401 is a fast turn on current source. The control terminal of the current source 401 is coupled to the third terminal of the bootstrap circuit 10 for receiving the high side control signal $S_H$. The output terminal of the current source 401 is configured to provide the first bootstrap signal BST1.

When the high side control signal $S_H$ is in an active state (i.e., the low side switch 22 is turned off and the high side switch 21 needs to be turned on), the current source 401 is configured to provide the first bootstrap signal BST1. In the exemplary embodiment of FIG. 5, the first bootstrap signal BST1 is a current signal. In one embodiment, the high side control signal $S_H$ is logic high when it is in the active state. In another embodiment, the high side control signal $S_H$ is logic low when it is in the active state.

In the exemplary embodiment of FIG. 5, the pre-charger 11 may further comprise a pulse generator 402 having a first terminal and a second terminal. The first terminal of the pulse generator 402 is coupled to the third terminal of the bootstrap circuit 10 to receive the high side control signal $S_H$, and the second terminal of the pulse generator 402 is coupled to the control terminal of current source 401. The pulse generator 402 may be configured to generate a pulse signal at the second terminal when an active edge of the high side control signal $S_H$ arrives. For example, if a logic high state of the high side control signal $S_H$ indicates an active state, the active edge of the high side control signal $S_H$ is a rising edge; and if a logic low state of the high side control signal $S_H$ indicates an active state, the active edge of the high side control signal $S_H$ is a declining edge.

When the high side control signal $S_H$ is low and the low side control signal $S_L$ is high, the high side driving signal $D_H$ is configured to turn the MOSFET 201 off and the low side driving signal $D_L$ is configured to turn the MOSFET 202 on so that the switching voltage $V_{SW}$ is equal to the ground potential and the bootstrap supply voltage $V_B$ charges the bootstrap capacitor 14 through the diode 13. When the high side control signal $S_H$ is high and the low side control signal $S_L$ is low, the low side driving signal $D_L$ is configured to turn the MOSFET 202 off. The voltage at the second terminal of the bootstrap capacitor 14 is pulled up to the switching voltage $V_{SW}$, thus the voltage at the first terminal of the bootstrap capacitor 14 is raised to the switching voltage $V_{SW}$ plus a voltage $V_{CB}$ across the bootstrap capacitor 14. (i.e., the second bootstrap signal BST2 is equal to $V_{SW}+V_{CB}$), which is provided to the first supply terminal of the high side driver 41 to charge the parasitic gate-source capacitor $C_{GS}$ of the MOSFET 201. Meanwhile, the current source 401 is turned on to provide the first bootstrap signal BST1. The first bootstrap signal BST1 is also provided to the first supply terminal of the high side driver 41 to charge the parasitic gate-source capacitor $C_{GS}$ of the MOSFET 201 through the diode 13. After the bootstrap capacitor 14, the parasitic gate-drain capacitor $C_{GD}$ and the parasitic gate-source capacitor $C_{GS}$ get charge balanced, the voltage across the parasitic gate-source capacitor $C_{GS}$ is larger than the conduction threshold of the MOSFET 201 so as to turn the MOSFET 201 on.

Figure 6:
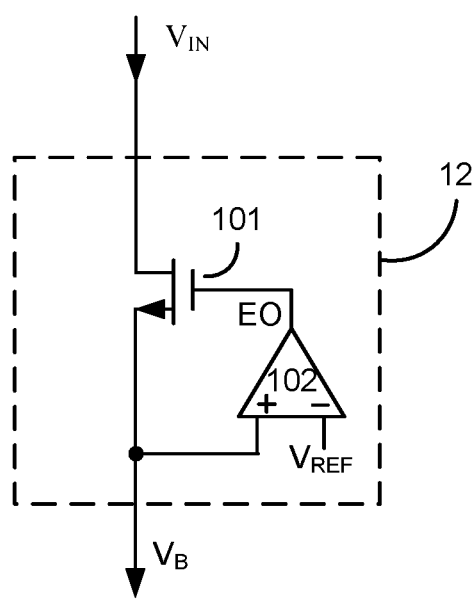
FIG. 6 schematically illustrates the LDO 12 in accordance with an exemplary embodiment of the present application.

FIG. 6 schematically illustrates the LDO 12 in accordance with an exemplary embodiment of the present application. In the exemplary embodiment of FIG. 6, the LDO 12 may comprise a transistor 101 and an error amplifier 102. The transistor 101 may have a first terminal coupled to the first terminal of the bootstrap circuit 10 to receive the input voltage signal $V_{IN}$, a second terminal coupled to the anode of the diode 13 to provide the supply voltage $V_B$, and a control terminal. The error amplifier 102 may have a first input terminal configured to receive a reference voltage signal $V_{REF}$, a second input terminal coupled to the second terminal of the transistor 101 to receive the supply voltage $V_B$, and an output terminal coupled to the control terminal of the transistor 101, wherein the error amplifier 102 is configured to amplify the difference of the reference voltage signal $V_{REF}$ and the supply voltage $V_B$ to provide an error signal EO at the output terminal for controlling the transistor 101.

Figure 7:
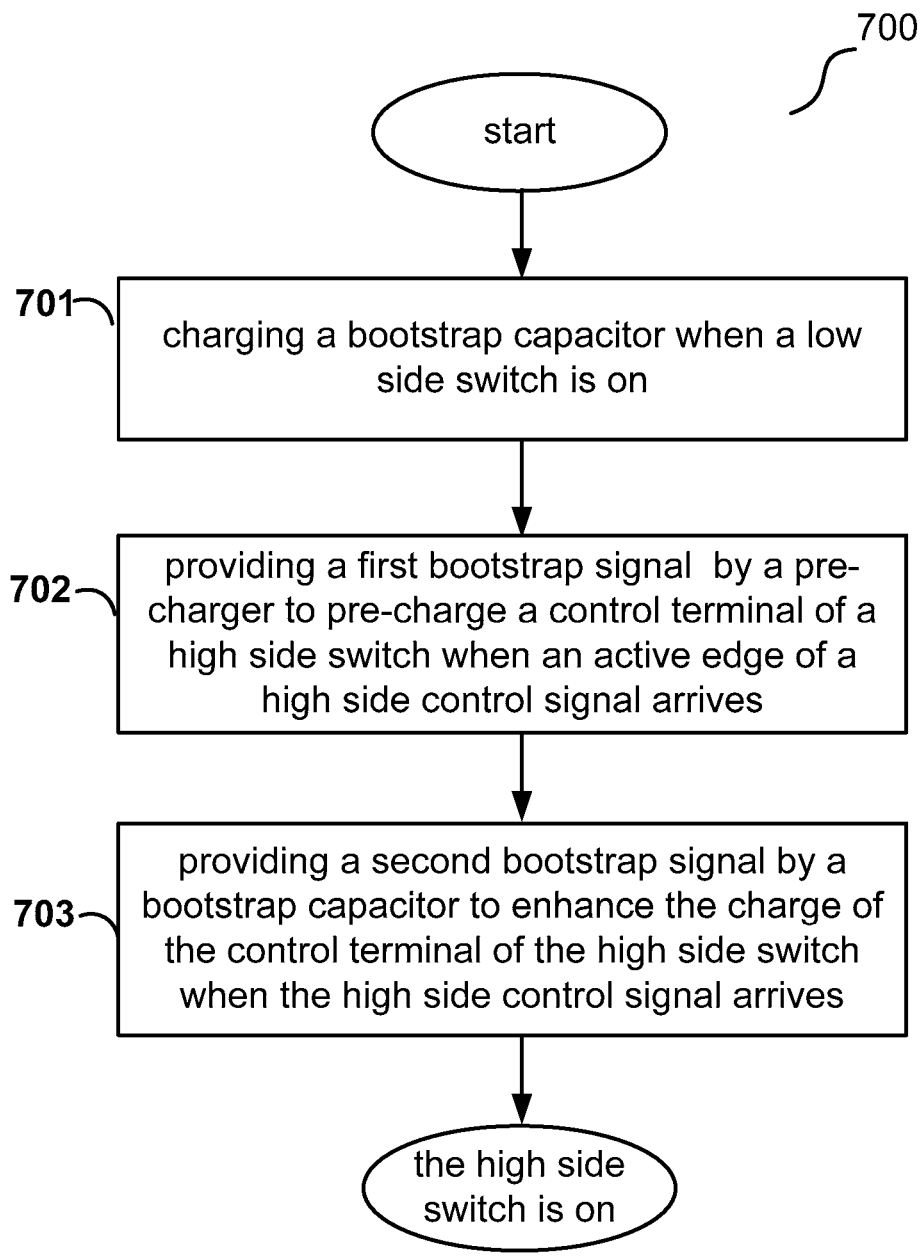
FIG. 7 illustrates a flow diagram of a driving method 700 for voltage converter IC having an integrated bootstrap capacitor in accordance with an exemplary embodiment of the present application.

FIG. 7 illustrates a flow diagram of a driving method 700 for a voltage converter IC having an integrated bootstrap capacitor in accordance with an exemplary embodiment of the present application. In the exemplary embodiment of FIG. 7, the voltage converter IC may comprise a high side switch (e.g., 21 in FIG. 3, 201 in FIG. 4), and a low side switch (e.g., 22 in FIG. 3, 202 in FIG. 4). The voltage converter IC is configured to receive an input voltage signal $V_{IN}$ and to provide a switching voltage signal $V_{SW}$ through driving the high side switch and the low side switch on and off complementarily. The driving method 700 may comprise step 701 to step 703.

In step 701, charging a bootstrap capacitor 14 when a low side control signal $S_L$ which is configured to control the low side switch 22 is active. In one embodiment, the low side control signal $S_L$ is active indicates that the low side switch 22 is turned on. In one embodiment, a logic high state of the low side control signal $S_L$ indicates that the low side control signal $S_L$ is active. In one embodiment, a logic low state of the low side control signal $S_L$ indicates that the low side control signal $S_L$ is active.

In step 702, providing a first bootstrap signal BST1 to pre-charge a control terminal of the high side switch 21 when an active edge of a high side control signal $S_H$ which is configured to control the high side switch 21 arrives. In one embodiment, if a logic high state of the high side control signal $S_H$ indicates an active state, the active edge of the high side control signal $S_H$ is a rising edge. In one embodiment, if a logic low state of the high side control signal $S_H$ indicates an active state, the active edge of the high side control signal $S_H$ is a declining edge.

In step 703, providing a second bootstrap signal BST2 by the bootstrap capacitor 14 to enhance the charge of the control terminal of the high side switch 21 when a high side control signal $S_H$ is active. In one embodiment, the high side control signal $S_H$ is active indicates that the high side switch 21 is turned on. In one embodiment, a logic high state of the high side control signal $S_H$ indicates that the high side control signal $S_H$ is active. In one embodiment, a logic low state of the high side control signal $S_H$ indicates that the high side control signal $S_H$ is active.

Methods and steps of driving the voltage converter IC described above in the various embodiments of the present invention are illustrative and not intended to be limiting. Well known controlling steps, operating processes, and parameters etc. are not described in detail to avoid obscuring aspects of the invention. Those skilled in the art should understand that the steps described in the embodiments with reference to FIG. 7 may be implemented in different orders and are not limited to the embodiments described.

Although a bootstrap circuit, a voltage converter IC and associated control methods are illustrated and explained based on a buck type power converter according to various embodiments of the present invention, this is not intended to be limiting. Persons of ordinary skill in the art will understand that the circuits, methods and principles taught herein may apply to any other suitable types of power converters, such as boost type power converters, buck-boost type power converters or flyback type power converters etc.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

What is claimed is:

1. A bootstrap circuit for driving a high side switch of a voltage converter integrated circuit (IC), wherein the bootstrap circuit is integrated into the voltage converter IC, the bootstrap circuit comprising:
   a pre-charger, configured to provide a first bootstrap signal at an output terminal of the pre-charger to pre-charge a control terminal of the high side switch;
   a Low Drop Out linear regulator (LDO), coupled to an input terminal of the voltage converter IC to receive an input voltage
   signal, and further configured to regulate the input voltage signal to provide a supply voltage signal at an output terminal of the LDO;
   a diode having an anode coupled to the output terminal of the LDO and the output terminal of the pre-charger, and a cathode; and
   a bootstrap capacitor having a first terminal coupled to the control terminal of the high side switch and the cathode of the diode, and a second terminal coupled to a common connection of the high side switch and a low side switch of the voltage converter IC, and wherein the bootstrap capacitor is configured to provide a second bootstrap signal at the first terminal of the bootstrap capacitor to enhance the charge of the control terminal of the high side switch.

2. The bootstrap circuit of claim 1, wherein the pre-charger comprises a charging switch having a first terminal, a second terminal and a control terminal, and wherein the first terminal of the charging switch is coupled to an input terminal of the voltage converter IC to receive an input voltage signal of the voltage converter IC, and the control terminal of the charging switch is configured to receive a high side control signal, and wherein the charging switch is configured to provide the first bootstrap signal at the second terminal once an active edge of the high side control signal arrives.

3. The bootstrap circuit of claim 2, wherein the pre-charger further comprises a pulse generator having a first terminal and a second terminal, and wherein the first terminal of the pulse generator is configured to receive the high side control signal, and the second terminal of the pulse generator is coupled to the control terminal of the charging switch, and wherein the pulse generator is configured to generate a pulse signal at its second terminal once the active edge of the high side control signal arrives.

4. The bootstrap circuit of the claim 2, wherein the charging switch comprises a P-type MOSFET.

5. The bootstrap circuit of claim 1, wherein the pre-charger comprises a current source having a control terminal and an output terminal, and wherein the control terminal of the current source is configured to receive a high side control signal, and wherein the current source is configured to provide the first bootstrap signal at the output terminal of the current source once an active edge of the high side control signal arrives.

6. The bootstrap circuit of claim 5, wherein the pre-charger further comprises a pulse generator having a first terminal and a second terminal, and wherein the first terminal of the pulse generator is configured to receive the high side control signal, and the second terminal of the pulse generator is coupled to the control terminal of the current source, and wherein the pulse generator is configured to generate a pulse signal at its second terminal once the active edge of the high side control signal arrives.

7. The bootstrap circuit of claim 1, wherein the LDO comprises:
   a transistor having a first terminal, a second terminal and a control terminal, wherein the first terminal of the transistor is coupled to the input terminal of the voltage converter IC to receive the input voltage signal, and the second terminal is coupled to the anode of the diode to provide the supply voltage; and
   an error amplifier having a first input terminal configured to receive a reference voltage signal, a second input terminal coupled to the second terminal of the transistor to receive the supply voltage, and an output terminal coupled to the control terminal of the transistor, wherein the error amplifier is configured to amplify the difference of the reference voltage signal and the supply voltage to provide an error signal at the output terminal for controlling the transistor.

8. A voltage converter IC having an input pin, a switching pin, a feedback pin and a logic ground pin, comprising:
   a switching circuit having a high side switch and a low side switch, wherein the high side switch and the low side switch are connected in series between the input pin and the logic ground pin, and a common connection of the high side switch and the low side switch is operated as the switching pin, and wherein the switching circuit is configured to convert the input voltage at the input pin to a switching voltage at the switching pin by controlling the high side switch and the low side switch;
   a control circuit, coupled to the feedback pin to receive a feedback signal, and configured to generate a high side control signal and a low side control signal based on the feedback signal; and a bootstrap circuit, comprising:
  a pre-charger, configured to receive the high side control signal and the input voltage signal, and further configured to provide a first bootstrap signal based on the high side control signal and the input voltage signal at an output terminal of the pre-charger;
  a Low Drop Out linear regulator (LDO), coupled to the input pin to receive the input voltage signal, and configured to regulate the input voltage signal to provide a supply voltage signal at an output terminal of the LDO;
  a diode having an anode coupled to the output terminal of the LDO and the output terminal of the pre-charger, and a cathode; and
  a bootstrap capacitor having a first terminal coupled to the control terminal of the high side switch and the cathode of the diode, and a second terminal coupled to the switching pin, configured to provide a second bootstrap signal at the first terminal of the bootstrap capacitor, wherein the first bootstrap voltage signal and the second bootstrap voltage signal are configured to charge a control terminal of the high side switch through a driving circuit.

9. The voltage converter IC of claim 8, wherein the driving circuit comprises:
  a high side driver having an input terminal, a first supply terminal, a second supply terminal and an output terminal, wherein the input terminal of the high side driver is coupled to the control circuit to receive the high side control signal, the first supply terminal is coupled to the bootstrap circuit to receive a bootstrap voltage signal, and the second supply terminal is coupled to the switching pin, and wherein the high side driver is configured to provide a high side driving signal at the output terminal of the high side driver based on the high side control signal and the bootstrap voltage signal, and wherein the high side driving signal is configured to drive the high side switch on and off; and
  a low side driver, coupled to the control circuit to receive the low side control signal, and configured to generate a low side driving signal based on the low side control signal to drive the low side switch on and off.

10. The voltage converter IC of claim 8, wherein the pre-charger comprises a charging switch having a first terminal, a second terminal and a control terminal, the first terminal of the charging switch receives an input voltage signal of the voltage converter IC; the control terminal of charging switch is coupled to the control circuit to receive a high side control signal; and the charging switch is configured to provide the first bootstrap signal at the second terminal once an active edge of the high side control signal arrives.

11. The bootstrap circuit of the claim 10, wherein the pre-charger further comprises a pulse generator having a first terminal and a second terminal, wherein the first terminal of the pulse generator is coupled to the control circuit to receive the high side control signal, and the second terminal of the pulse generator is coupled to the control terminal of the charging switch, and wherein the pulse generator is configured to generate a pulse signal at its second terminal once the active edge of the high side control signal arrives.

12. The voltage converter IC of claim 8, wherein the pre-charger comprises a current source having a control terminal and an output terminal, wherein the control terminal of the current source is coupled to the control circuit to receive a high side control signal, and wherein the current source is configured to provide the first bootstrap signal at the output terminal of the current source once an active edge of the high side control signal arrives.

13. The bootstrap circuit of the claim 12, wherein the pre-charger further comprises a pulse generator having a first terminal and a second terminal, wherein the first terminal of the pulse generator is coupled to the control circuit to receive the high side control signal, and the second terminal of the pulse generator is coupled to the control terminal of the current source, and wherein the pulse generator is configured to generate a pulse signal at its second terminal once the active edge of the high side control signal arrives.

14. A driving method for voltage converter IC having an integrated bootstrap capacitor, wherein the voltage converter IC has a high side switch and a low side switch being turned on and off complementarily, the driving method comprising:
  charging a bootstrap capacitor by a supply voltage when a low side control signal configured to control the low side switch is active, wherein a Low Drop Out linear regulator (LDO) is configured to receive an input voltage to generate the supply voltage, and a diode is coupled between the LDO and the bootstrap capacitor to prevent the bootstrap capacitor from discharging to the LDO;
  providing a first bootstrap signal by a pre-charger to pre-charge a control terminal of the high side switch when an active edge of the high side control signal configured to control the high side switch arrives; and
  providing a second bootstrap signal by the bootstrap capacitor to enhance the charge of the control terminal of the high side switch when a high side control signal is active.

15. The driving method of claim 14, wherein the pre-charger comprises a charging switch having a first terminal, a second terminal and a control terminal, and wherein the first terminal of the charging switch receives an input voltage signal of the voltage converter IC, and the control terminal of the charging switch is configured to receive the high side control signal, and wherein the charging switch is configured to provide the first bootstrap signal at the second terminal once the active edge of the high side control signal arrives.

16. The driving method of claim 14, wherein the pre-charger comprises a current source having a control terminal and an output terminal, and wherein the control terminal of the current source is configured to receive the high side control signal, and wherein the current source is configured to provide the first bootstrap signal at the output terminal of the current source once the active edge of the high side control signal arrives.

* * * * *